United States Patent [19]
Nagaraj et al.

[11] Patent Number: 5,412,263
[45] Date of Patent: May 2, 1995

[54] MULTIPLE CONTROL VOLTAGE GENERATION FOR MOSFET RESISTORS

[75] Inventors: Krishnaswamy Nagaraj, Macungie, Pa.; Reza S. Shariatdoust, Califon, N.J.

[73] Assignee: AT&T Corp., Murray Hill, N.J.

[21] Appl. No.: 954,839

[22] Filed: Sep. 30, 1992

[51] Int. Cl.$^6$ .................. H03K 5/14; H03K 17/687
[52] U.S. Cl. ............................... 327/566; 327/581
[58] Field of Search ............... 307/303.2, 571, 603

[56] References Cited
U.S. PATENT DOCUMENTS

| | | | |
|---|---|---|---|
| 4,028,562 | 6/1977 | Zuleeg | 307/303.2 |
| 5,185,540 | 2/1993 | Bougry | 307/603 |
| 5,359,301 | 10/1994 | Candage | 307/603 X |

*Primary Examiner*—Willis R. Wolfe
*Attorney, Agent, or Firm*—Richard D. Laumann

[57] ABSTRACT

Control voltages are generated so that each transistor in a plurality of parallel connected field effect transistors turns ON with smooth transitions between transistors and in a manner that is relatively insensitive to processing and operating temperature variations.

6 Claims, 2 Drawing Sheets

MULTIPLE CONTROL VOLTAGE GENERATION FOR MOSFET RESISTORS

TECHNICAL FIELD

This invention relates to circuits suitable for the generation of multiple control voltages used with, for example, MOSFET resistors.

BACKGROUND OF THE INVENTION

There are circuits or devices using integrated circuits which require circuit parameters to vary in a controlled manner to compensate for variations in the signal input. For example, repeaters in telephone systems must deal with variable line lengths, i.e., variable distances between repeaters. The amplitude of the regenerated signal depends upon the distance between repeaters, and the circuits which regenerate the signal must compensate for variable line lengths. As another example, the signal received directly from a magnetic disk as the disk is read typically has both pulse shape and amplitude variations. The circuit which processes this signal must be able to compensate and correct these variations. The parameter that is frequently varied, in the examples described as well as in other situations, to compensate for such variations is a resistance.

A common choice of a variable resistance is the source/drain resistance of an MOS field effect transistor operating in the triode region. In this region, the FET transistor behaves approximately like a linear resistance whose value is a function of gate voltage. The range of the gate voltage is bounded on the upper end by the supply voltage and on the lower end by the minimum overdrive (above the threshold voltage) required to keep the device in the triode region. This limits the range of resistances obtainable from the transistor. In fact, a typical range is only a factor of 3. However, for many applications the resistance must be varied over a substantial range; for example, an order of magnitude or more, that is significantly larger than is the linear region of a single field effect transistor. This wide requirement arises from the fact that the resistance has to compensate not only for the input variations, but also for its own variability due to processing and ambient temperature variations.

One way to increase the range of available resistance is to connect a plurality of transistors in parallel. The transistors have different sizes and different control voltages; that is, they turn ON at different voltages. The individual control voltages are derived from a single voltage. As this voltage increases, the first transistor turns ON and the equivalent resistance of that transistor decreases until it reaches the limit determined by its maximum gate drive. At this point, the second transistor turns ON and the described process repeats.

However, the circuit with parallel connected transistors just described will work properly only if there is a smooth transition from one transistor to the next transistor. That is, a transistor should turn ON at the point where the resistance of the previous transistor levels off. This is possible if the transitions are substantially independent of device processing and operating temperature. This, in turn, requires that the individual control voltages for each transistor be generated properly.

SUMMARY OF THE INVENTION

A variable resistor is produced with a plurality of parallel connected field effect transistors, each having a gate electrode, and means for generating control voltages for each of the field effect transistors. The resistance is formed by the source/drain resistances of the transistors. The means for generating control voltages is formed by a plurality of field effect transistors, each having a current carrying element connected between a source electrode and a reference potential, a transfer circuit, at least one of the transistors has a source electrode connected to the transfer circuit, and means for generating a reference voltage connected to the transfer circuit. In one embodiment, the current carrying element is an impedance. In a preferred embodiment, the element is a resistor. The resistor is used in, for example, integrated circuits.

DETAILED DESCRIPTION

The invention will first be described by reference to a particular embodiment which is only illustrative.

Figure 1:
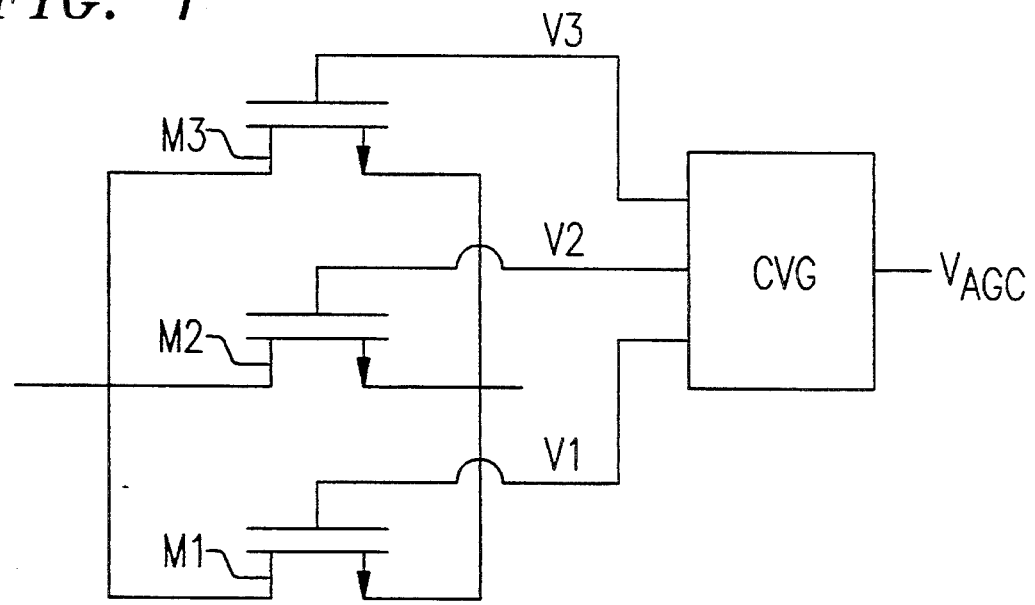
FIG. 1 is a schematic representation of a circuit using parallel connected field effect transistors to produce a variable resistance.

FIG. 1 depicts first, second, and third field effect transistors, indicated as M1, M2, and M3, respectively, that are connected in parallel. M1, M2, and M3 form a plurality of first parallel connected field-effect transistors. Control voltages, V1, V2 and V3, are applied to the gate electrodes of M1, M2, and. M3, respectively. The control voltages are generated by control voltage generator, CVG, which has an input voltage $V_{AGC}$. The three transistors turn-on at different values of $V_{AGC}$, with M1 having the smallest turn-on voltage and M3 the largest turn-on voltage. M1 turns on first and its conductivity increases until it saturates. At approximately this point, M2 turns on and, when it saturates, M3 turns on and so forth. The transistors must turn on at the proper point and this requires appropriate control voltages. Those skilled in the art will readily fabricate the transistors with appropriately selected turn on voltages.

Figure 2:
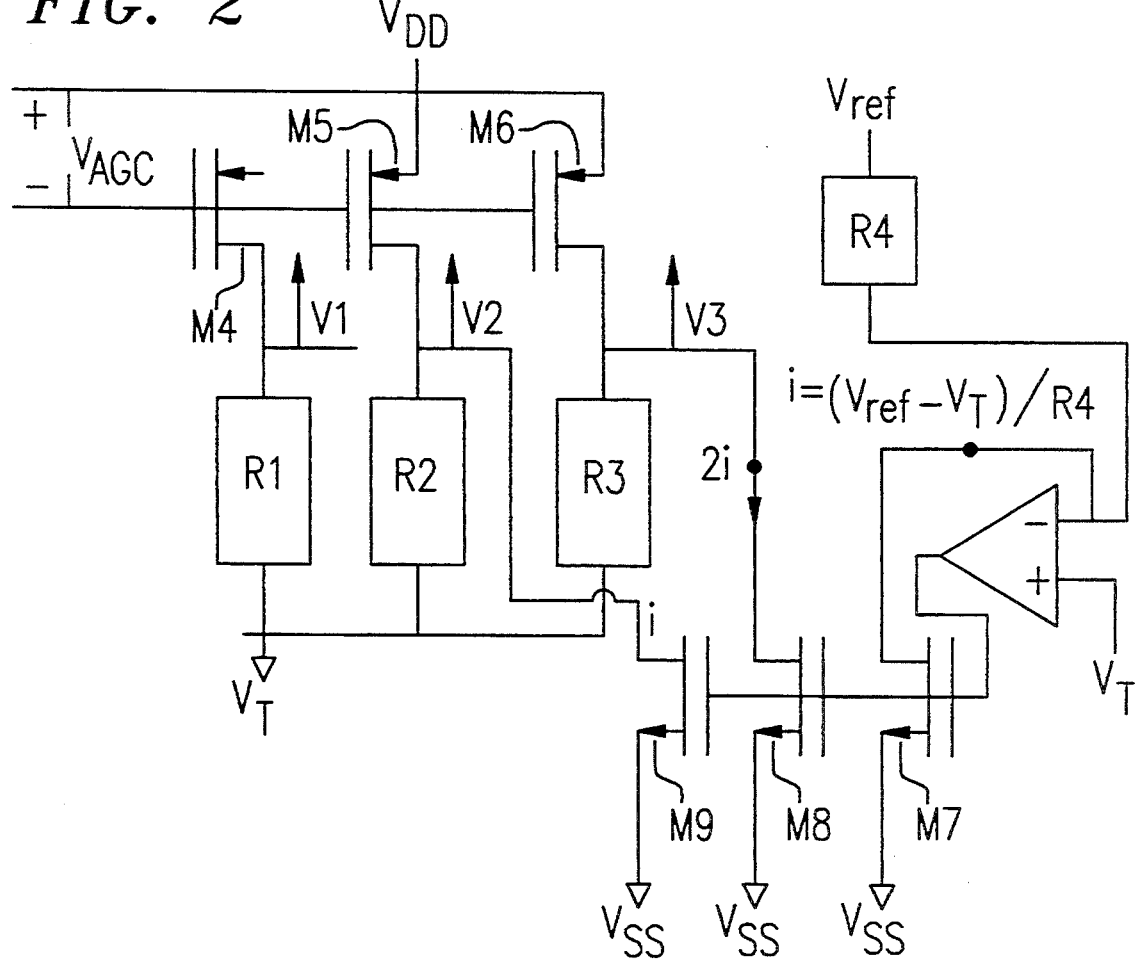
FIG. 2 is a schematic representation of a circuit useful in generating appropriate control voltages for parallel connected field effect transistors.

A circuit useful for generating the control voltages V1, V2, and V3, is depicted in FIG. 2. The circuit has three current source transistors shown as M4, M5, and M6, respectively, and three current carrying elements which are shown as resistive elements, R1, R2 and R3, respectively. M4, M5, and M6 form a second plurality of transistors. The resistive elements are each connected to a single transistor as shown. They are connected to a source electrode and a reference potential as shown. $V_{AGC}$ and $V_{DD}$ are also shown. The control voltages, V1, V2 and V3, are taken from the source electrodes of transistors M4, M5, and M6, respectively. The control voltages are applied to the gate electrodes of the transistors of the first plurality. There are two sink currents, i and $2i$, which are generated by M9 and M8 and connected to M5 and M6, respectively. The transistors, M7, M8, and M9, in combination with an operational amplifier, the resistor, R4, generates the two sink currents, such that $i = (V_{ref} - V_T)/R4$. The width to length ratios of the channels of M7, M8, and M9 are 1:2:1. The operational amplifier and R4 form a transfer circuit. The sink currents are derived from $V_{ref}$ and R4. The resistive elements may be either passive or active elements. Nominally, the resistances are equal; i.e., R1=R2=R3=R4=R.

The operation of the circuit is easily explained. $V_{AGC}$ increases from zero and goes past the threshold voltage for M4, M5 and M6. These transistors turn ON and initially carry the same current. The current from M4 flows entirely through R1, thereby causing V1 to increase. However, the currents from M5 and M6 are initially absorbed by their sink currents. Thus, V2 and V3 remain at the reference $V_T$. Eventually, V1 increases beyond $V_{ref}$ when the current in M4 exceeds $(V_{ref}-V_T)/R$. At this point, the current in M5 also exceeds $(V_{ref}-V_T)/R$. Any further increase in $V_{AGC}$ results in a net current flow into R2. This causes V2 to increase although V3 remains at $V_T$. However, at the point where V2 exceeds $V_{ref}$, the current in M6 would be larger than $2(V_{ref}-V_T)/V_R$. This forces a current flow into R3 and V3 increases.

Provided that $V_{ref}$ is constant and that the transistors and resistors are matched, the relationship between the points of turning on of M1, M2, and M3 will be independent of the absolute values of the circuit parameters. Thus, the operation of the control voltage generator is independent of processing and ambient temperature variations.

Those skilled in the art will choose an appropriate value for $V_{ref}$. If $V_{ref}$ is chosen close to $V_{DD}$ (which is the maximum voltage in the system), then there would be virtually no overlap between the three segments of the overall transfer curve ($V_{AGC}$ versus the net equivalent resistance of the combination of M1, M2, and M3); that is, M2 (M3) starts to conduct only after M1 (M2) had completely leveled off. If $V_{ref}$ is chosen to be somewhat less than $V_{DD}$, then M2 (M3) starts to conduct before M1 (M2) has completely leveled off. This latter choice of $V_{ref}$ would ensure a continuum in the overall transfer curve (avoiding dead zones).

Figure 3:
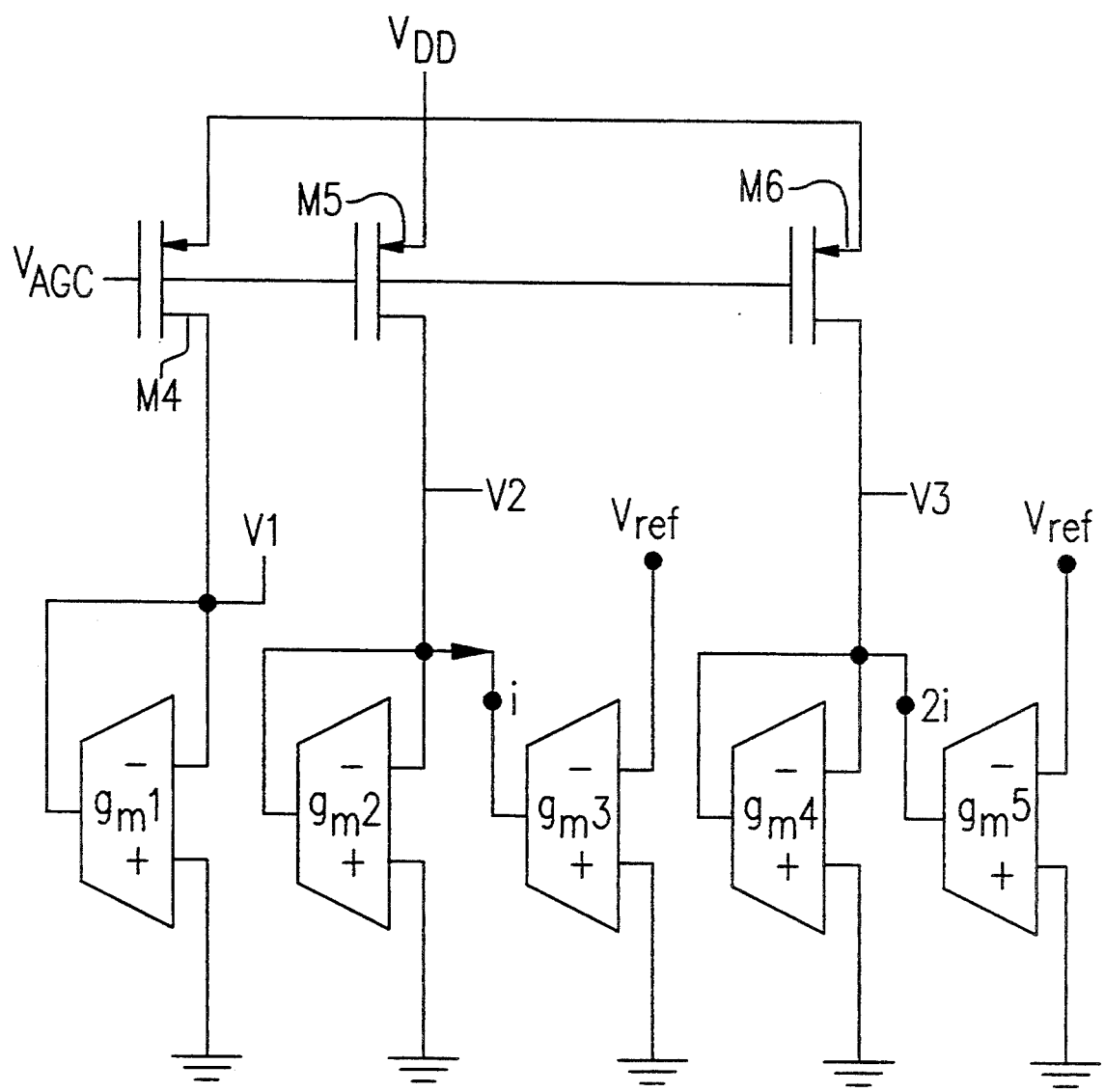
FIG. 3 is a schematic representation of a circuit useful in generating appropriate control voltages for parallel connected field effect transistors.

FIG. 3 illustrates another embodiment of the invention. In this embodiment, the current carrying elements are shown as conductances. There is a plurality of conductances, $g_m1$, $g_m2$, $g_m3$, $g_m4$, and $g_m5$, with $g_m1 = g_m2 = g_m3 = g_m4 =$ and $g_m5 = 2 g_m4$. The transfer circuit also comprises a conductance. Those skilled in the art will readily understand the operation of the circuit.

Variations in the embodiment described will be apparent to those skilled in the art. For example, although three transistors are depicted, two or more may be used.

We claim:

1. A variable resistor comprising:
    a plurality of first parallel connected field effect transistors, each having a gate electrode, the resistance of said resistor being the source/drain resistances of said transistors;
    means for generating analog control voltages for each of said first field effect transistors, said means comprising a plurality of second field effect transistors, current carrying elments connected between source electrodes of said second field effect transistors and a reference potential, said source electrodes of transistors of said second plurality being connected to said gate electrodes of transistors of said first plurality;
    a current transfer circuit, at least one of said second transistors having a source electrode connected to said current transfer circuit; and
    means for generating a reference voltage connected to said current transfer circuit.

2. A variable resistor as recited in claim 1 in which said current carrying element comprises a resistance.

3. A variable resistor as recited in claim 2 in which said means for generating provides a smooth turn-on transition for said plurality of first parallel connected field effect transistor.

4. An integrated circuit comprising:
    a plurality of first parallel connected field effect transistors, each having a gate electrode, the resistance of said resistor being the source/drain resistances of said transistors;
    means for generating analog control voltages for each of said first field effect transistors, said means comprising a plurality of second field effect transistors, current carrying elements connected between a source electrodes of said second field effect transistors, and a reference potential, said source electrodes of transistors of said second plurality being connected to said gate electrodes of transistors of said first plurality;
    a current transfer circuit, at least one of said transistors having a source electrode connected to said current transfer circuit; and
    means for generating a reference voltage connected to said current transfer circuit.

5. An integrated circuit as recited in claim 4 in which said current carrying element comprises a resistance.

6. An integrated circuit as recited in claim 4 in which said means for generating provides a smooth turn-on transistion for said plurality of first parallel connected field effect transistors.

* * * * *